(12) United States Patent
Nebendahl

(10) Patent No.: US 10,641,964 B2
(45) Date of Patent: May 5, 2020

(54) CONTINUOUS PHASE TUNING SYSTEM WITH LOOP MIRROR

(71) Applicant: Keysight Technologies, Inc., Santa Rosa, CA (US)

(72) Inventor: Bernd Nebendahl, Ditzingen (DE)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/245,803

(22) Filed: Jan. 11, 2019

(65) Prior Publication Data

US 2019/0293870 A1    Sep. 26, 2019

Related U.S. Application Data

(60) Provisional application No. 62/646,436, filed on Mar. 22, 2018.

(51) Int. Cl.
| | |
|---|---|
| *G02B 6/293* | (2006.01) |
| *H01S 5/062* | (2006.01) |
| *H01S 5/0625* | (2006.01) |
| *G02F 1/313* | (2006.01) |
| *H01S 5/14* | (2006.01) |
| *H01S 5/10* | (2006.01) |

(Continued)

(52) U.S. Cl.
CPC ......... *G02B 6/29338* (2013.01); *G02F 1/225* (2013.01); *G02F 1/3136* (2013.01); *H01S 5/0687* (2013.01); *H01S 5/06246* (2013.01); *H01S 5/06256* (2013.01); *H01S 5/1007* (2013.01); *H01S 5/141* (2013.01)

(58) Field of Classification Search
CPC ... G02B 6/29338; G02F 1/225; G02F 1/3136; H01S 5/06246; H01S 5/06256; H01S 5/0687; H01S 5/1007; H01S 5/141
See application file for complete search history.

(56) References Cited

U.S. PATENT DOCUMENTS

| | | | | |
|---|---|---|---|---|
| 5,655,039 | A * | 8/1997 | Evans | G02F 1/3519 385/27 |
| 7,620,274 | B2 * | 11/2009 | Atieh | G02F 1/3519 385/15 |
| 8,787,708 | B2 | 7/2014 | Doerr | |

(Continued)

OTHER PUBLICATIONS

David A.B. Miller, "Perfect Optics with Imperfect Components," Optica, vol. 2, No. 8 (Aug. 2015), pp. 747-750.

*Primary Examiner* — Chris H Chu

(57) ABSTRACT

A system for continuously phase tuning an optical signal includes one optical switch coupled to a phase modulator having a first waveguide with a first phase shifter and a second waveguide with a second phase shifter. The optical switch alternately switches between the first and second phase shifters to phase shift the optical signal, respectively. The continuously phase tuning system further includes a loop mirror that alternately receives the phase shifted optical signal from the first and second waveguides in accordance with the switching, via corresponding first and second mirror inputs, respectively, and reflects the phase shifted optical signal back to the same first or second mirror input at which the phase shifted optical signal was received. First and second phase values of the first and second phase shifters are determined such that overall phase change continues to accumulate substantially linearly.

20 Claims, 6 Drawing Sheets

(51) Int. Cl.
G02F 1/225 (2006.01)
H01S 5/0687 (2006.01)

(56) References Cited

U.S. PATENT DOCUMENTS

| 8,885,679 B1 | 11/2014 | Roth et al. |
| 9,575,256 B2 | 2/2017 | Li et al. |
| 2013/0044974 A1 | 2/2013 | Doerr |
| 2017/0293083 A1 | 10/2017 | Menard et al. |

* cited by examiner

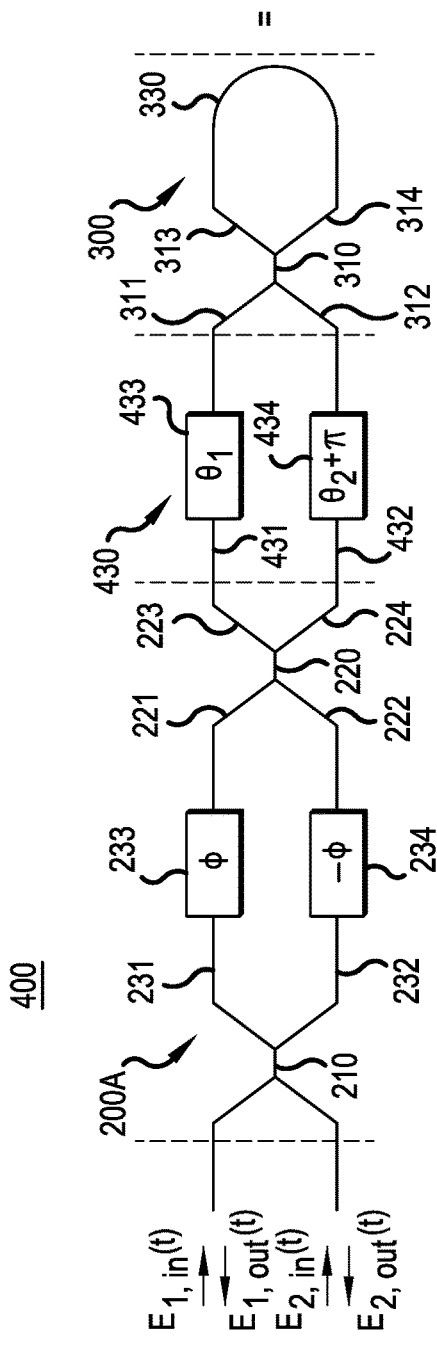
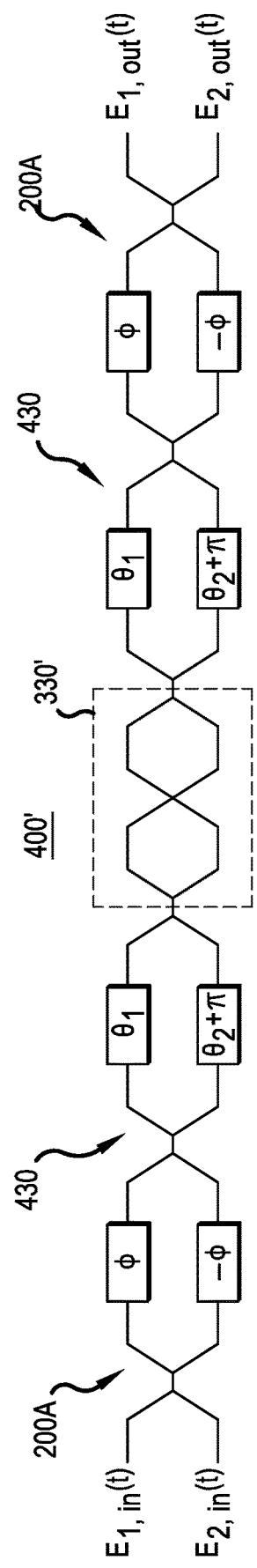
FIG.4A
FIG.4B

CONTINUOUS PHASE TUNING SYSTEM WITH LOOP MIRROR

CROSS-REFERENCE TO RELATED APPLICATION

The present application claims priority under 35 U.S.C. § 119(e) to U.S. Provisional Application No. 62/646,436 filed on Mar. 22, 2018. The entire disclosure of U.S. Provisional Application No. 62/646,436 is specifically incorporated herein by reference.

BACKGROUND

A tunable laser has a wavelength of operation of the laser light (optical signal) that may be altered or tuned during operation. To continuously phase tune a laser, for example, either the length of the laser cavity (via a delay line) is kept at a fixed multiple of the emitting wavelength of the optical signal, or phase is continually shifted by an endless reset free continuous phase shifter integrated into the cavity. Keeping the cavity at a fixed multiple of the emitting wavelength is typically realized by design in mechanically tuned external cavity lasers using, for example, Littman-Metcalf geometry, and requires large opto-mechanical building blocks and extreme mechanical stability combined with control loops to maintain the desired ratio. An integrated endless reset free continuous phase shifter may be realized using a frequency shifter inside the cavity, although alternative realizations may use rotating waveplates and a lithium niobate ($LiNbO_3$) polarization modulator. However, such modulators are difficult to operate due to dependency on temperature, intrinsic hysteretic behavior and intrinsic high losses.

An endless phase shifter or the equivalent an optical frequency shifter may be built using rotating waveplates. The waveplates may be actual waveplates that are mechanically rotating, which limits the tuning speed to unusable, low values. When building the waveplate from field induced birefringent material, problems operating this material must be solved. For example, temperature dependence and hysteresis are problematic.

What is needed, therefore, is an endless phase shifter without moving parts (e.g., mechanically rotating waveplates, that provides continuous phase tuning of a laser, for example, that is efficient and low cost.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 4A is a schematic diagram of a continuous phase tuning system, incorporating a loop mirror, according to a representative embodiment.

FIG. 4B is a schematic diagram of a functionally equivalent circuit of the continuous phase tuning system in FIG. 4A, according to a representative embodiment.

DETAILED DESCRIPTION

Figure 1:
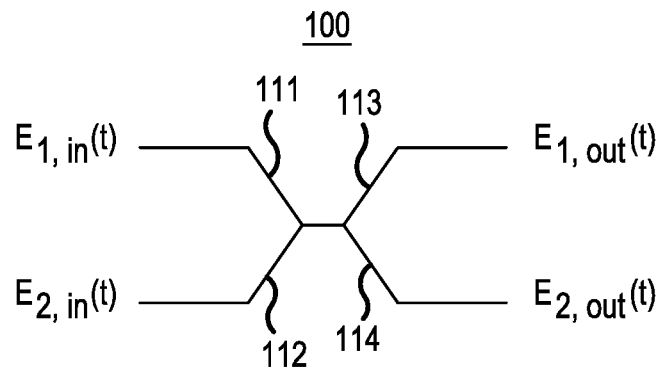
FIG. 1 is a schematic diagram of a 2×2 optical coupler.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element (e.g., a signal transmission line) is said to be connected to a second element (e.g., another signal transmission line), this encompasses cases where one or more intermediate elements (e.g., an electrical connector) may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a semiconductor package or coaxial cable) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

A tunable laser that includes integrated photonic circuits ("integrated laser") has a number of advantages over a mechanically tuned external cavity laser. For example, the integrated laser has no moving parts. This leads to potentially faster tuning, which enables higher throughput of the tunable laser, as well as increased reliability, no mechanical wear, smaller size, lower production costs and potentially less frequent calibration cycles of the tunable laser. Also, sensitivity to mechanical vibrations is minimized. To continuously phase tune a laser with the cavity built using integrated photonics, a practically endless phase shifter inside the cavity is needed since it is not possible to change the optical path length of an integrated cavity substantially to the extent required for tunable lasers (e.g., approximately 15 percent change of optical path length would be required to tune a 1550 nm laser over 200 nm). That is, changing the phase of the light within the cavity effectively provides the same results as changing the physical length of the cavity.

The various embodiments of the disclosure are less complex than conventional solutions, such as that described by Doerr in U.S. Patent No. 2013/0044974 (published Feb. 21, 2013), which is hereby incorporated by reference. The embodiments use one optical switch (e.g., a Mach-Zehnder interferometer (MZI) switch), and hence are simpler to operate, and combine the required function of the loop mirror with the phase shifter.

The various embodiments may be implemented in any material system in which a phase modulator can be built, such silicon (Si), silicon dioxide ($SiO_2$), silicon nitride ($Si_3N_4$), or indium phosphide (InP), for example, although other material systems may be incorporated without departing from the scope of the present teachings. Using these material systems, for example, the phase can be changed using thermo-optic, stress-optic or electro-optic effects. Since there are no moving parts, high tuning speeds are readily achievable. Also, the various embodiments combine the function of a loop mirror and an endless phase shifter into one circuit with fewer phase modulated sections, simplifying external control.

FIG. 1 is a schematic diagram of a 2×2 optical coupler. Referring to FIG. 1, optical coupler 100 includes two input ports and two output ports, including a first input port 111 for inputting optical signal a second input port 112 for inputting optical signal $E_{2,in}(t)$, a first output port 113 for outputting optical signal $E_{1,out}(t)$, and a second output port 114 for outputting optical signal $E_{1,out}(t)$. The input and output fields of the optical coupler 100 are calculated according to Equations (1) and (2), below:

$$\begin{bmatrix} E_{1,out}(t) \\ E_{2,out}(t) \end{bmatrix} = \begin{bmatrix} \sqrt{\kappa} & i \cdot \sqrt{1-\kappa} \\ i \cdot \sqrt{1-\kappa} & \sqrt{\kappa} \end{bmatrix} \begin{bmatrix} E_{1,in}(t) \\ E_{2,in}(t) \end{bmatrix} \quad \text{Equation (1)}$$

$$\kappa = \frac{1}{2}: \begin{bmatrix} E_{1,out}(t) \\ E_{2,out}(t) \end{bmatrix} = \frac{1}{\sqrt{2}} \begin{bmatrix} 1 & i \\ i & 1 \end{bmatrix} \begin{bmatrix} E_{1,in}(t) \\ E_{2,in}(t) \end{bmatrix} \quad \text{Equation (2)}$$

Referring to Equations (1) and (2), κ is the power splitting ratio of the optical coupler and i is the imaginary unit ($i^2 = -1$).

Figure 2A:
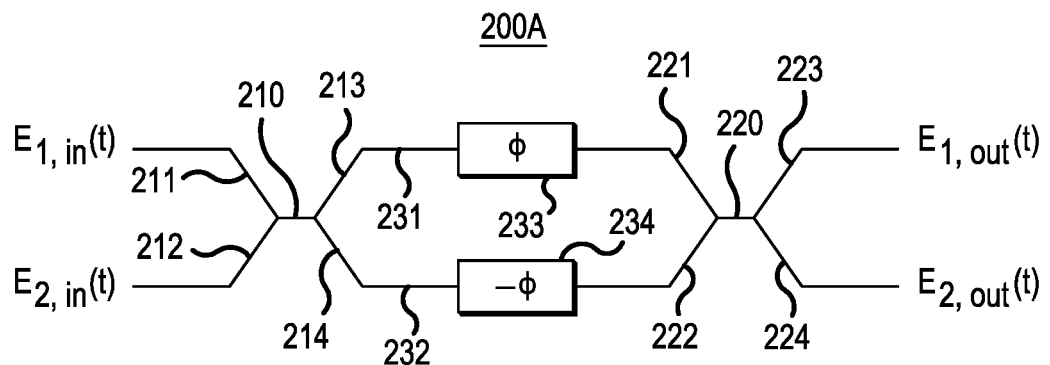
FIG. 2A is a schematic diagram of an optical switch, according to a representative embodiment.

FIG. 2A is a schematic diagram of an optical switch, according to a representative embodiment. Referring to FIG. 2, optical switch 200A may be a Mach-Zehnder Interferometer (MZI) switch, which includes first optical coupler 210, second optical coupler 220, first switch waveguide 231 with a first switch phase shifter 233 and second switch waveguide 232 with a second switch phase shifter 234. Each of the first and second switch waveguides 231 and 232, with the corresponding first and second switch phase shifters 233 and 234, is connected between the first and second optical couplers 210 and 220. In the depicted embodiment, the first switch phase shifter 233 shifts the phase of the optical signal by φ, and the second switch phase shifter 234 shifts the phase of the optical signal by −φ. In this configuration, the optical switch 200A effectively acts as a "cross-bar switch."

Each of the first and second optical couplers 210 and 220 is a 2×2 optical coupler, substantially the same as the optical coupler 100, so the description will not be repeated. The first optical coupler 210 includes input ports 211 and 212, and output ports 213 and 214. Likewise, the second optical coupler 220 includes input ports 221 and 222, and output ports 223 and 224. The input ports 211 and 212 correspond to input ports of the optical switch 200A, and the output ports 223 and 224 correspond to output ports of the optical switch 200A. Assuming that the first and second optical couplers 210 and 220 are symmetric 3 dB couplers, for example, the input and output fields of the optical switch 200A are related as indicated by Equations (3A) through (3D), in accordance with various phase values (φ), as follows:

$$\kappa = \frac{1}{2}, \quad \text{Equation (3A)}$$

$$\varphi = \varphi_1 = -\varphi_2: \begin{bmatrix} E_{1,out}(t) \\ E_{2,out}(t) \end{bmatrix} = i \begin{bmatrix} \sin(\varphi) & \cos(\varphi) \\ \cos(\varphi) & -\sin(\varphi) \end{bmatrix} \begin{bmatrix} E_{1,in}(t) \\ E_{2,in}(t) \end{bmatrix}$$

$$\varphi = -\frac{\pi}{2}: \begin{bmatrix} E_{1,out}(t) \\ E_{2,out}(t) \end{bmatrix} = i \begin{bmatrix} -1 & 0 \\ 0 & 1 \end{bmatrix} \begin{bmatrix} E_{1,in}(t) \\ E_{2,in}(t) \end{bmatrix} \quad \text{Equation (3B)}$$

$$\varphi = 0: \begin{bmatrix} E_{1,out}(t) \\ E_{2,out}(t) \end{bmatrix} = i \begin{bmatrix} 0 & 1 \\ 1 & 0 \end{bmatrix} \begin{bmatrix} E_{1,in}(t) \\ E_{2,in}(t) \end{bmatrix} \quad \text{Equation (3C)}$$

$$\varphi = \frac{\pi}{2}: \begin{bmatrix} E_{1,out}(t) \\ E_{2,out}(t) \end{bmatrix} = i \begin{bmatrix} 1 & 0 \\ 0 & -1 \end{bmatrix} \begin{bmatrix} E_{1,in}(t) \\ E_{2,in}(t) \end{bmatrix} \quad \text{Equation (3D)}$$

In the depicted embodiment, the optical switch 200A uses two couplers with 50/50 coupling ratios (first and second optical couplers 210 and 220) and two phase shifter sections (first and second switch phase shifters 233 and 234). To build a reliable optical switch (e.g., with a high extinction ratio), each of the first and second optical couplers 210 and 220 has an exact 50/50 coupling ratio, splitting the optical signal in half. Optical couplers with exact 50/50 coupling ratios may be difficult to manufacture, particularly when intended to operate over a wide range of wavelengths. Therefore, as an alternative configuration, the optical switch may include three optical couplers instead of two, essentially mimicking a perfect optical switch regardless of the actual coupling ratios of the individual optical couplers, as discussed below.

Figure 2B:
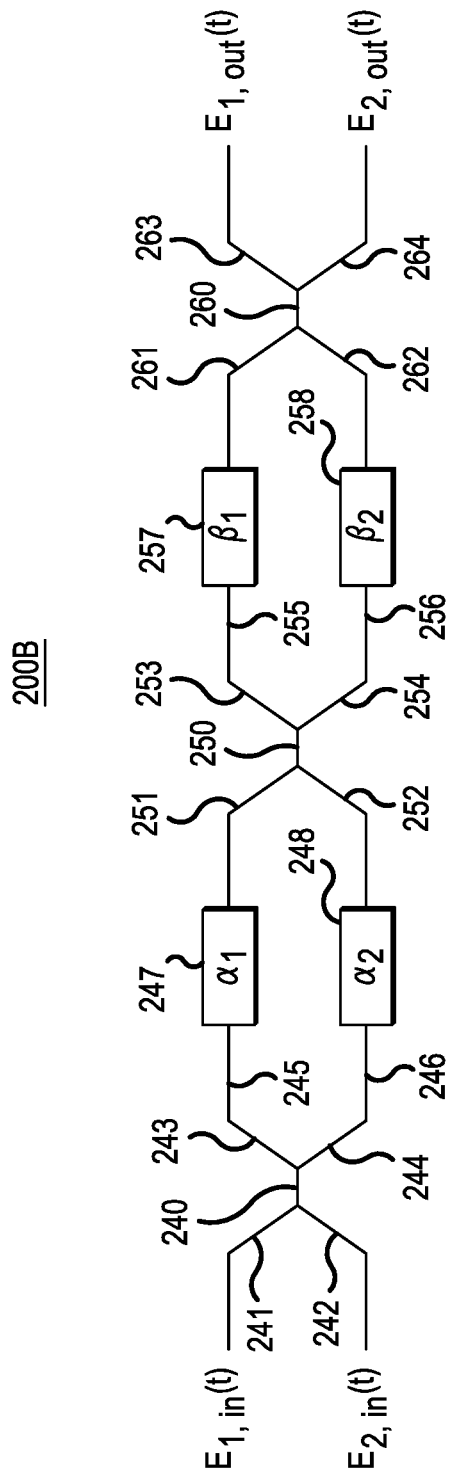
FIG. 2B is a schematic diagram of an optical switch, according to a representative embodiment.

FIG. 2B is a schematic diagram of an optical switch, according to another representative embodiment, including three optical couplers and four switch phase shifters. Referring to FIG. 2B, optical switch 200B likewise may be considered a MZI switch, with a modified configuration. The optical switch 200B includes first optical coupler 240, second optical coupler 250 and third optical coupler 260. A first switch waveguide 245 with a first switch phase shifter 247, and a second switch waveguide 246 with a second switch phase shifter 248, are arranged between the first optical coupler 240 and the second optical coupler 250. A third switch waveguide 255 with a third switch phase shifter 257, and a fourth switch waveguide 256 with a fourth switch phase shifter 258, are arranged between the second optical coupler 250 and the third optical coupler 260.

In the depicted embodiment, the first switch phase shifter 247 shifts the phase of the optical signal by $\alpha_1$, and the second switch phase shifter 248 shifts the phase of the optical signal by $\alpha_2$. Similarly, the third switch phase shifter 257 shifts the phase of the optical signal by $\beta_1$, and the fourth switch phase shifter 258 shifts the phase of the optical signal by $\beta_2$. The phase shift values $\alpha_1$, $\alpha_2$, $\beta_1$ and $\beta_1$ implemented by the first, second, third and fourth switch phase shifters 247, 248, 257 and 258, respectively, depend on the respective coupling ratios of the first, second and third optical couplers 240, 250 and 260, as well as on the desired state of the optical switch 200B (e.g., switch to either of output ports 263 and 264 or switch to some in between state). For example, the phase shift values may be determined experimentally for each switch assembly (the first and second switch phase shifters 247, 248 and the third and fourth switch phase shifters 257, 258) and operation wavelength due to wavelength dependence of the respective coupling ratios, as would be apparent to one skilled in the art. Generally, the phase shift values $\alpha_1$, $\alpha_2$, $\beta_1$ and $\beta_1$ of the first, second, third and fourth switch phase shifters 247, 248, 257 and 258, respectively, are determined such that a flat overall phase is maintained from input ports 241 and 242 to the respective output ports 263 and 264, while changing the switch state of the optical switch 200B. An example of determining phase shift values is provided by Miller, "Perfect Optics with Imperfect Components," *Optica*, Vol. 2, No. 8 (August 2015), p. 747, which is hereby incorporated by reference. In the depicted configuration, the optical switch 200B effectively acts as a "cross-bar switch."

Each of the first, second and third optical couplers 240, 250 and 260 of the optical switch 200B is a 2×2 optical coupler, substantially the same as the optical coupler 100, so the description will not be repeated. In comparison to the first and second optical couplers 210 and 220 in FIG. 2A, none of the first, second and third optical couplers 240, 250 and 260 needs to have a 50/50 coupling ratio (although a 50/50 coupling ratio may be included in any or all of the first, second and third optical couplers 240, 250 and 260 without departing from the scope of the present teachings). That is, each of the first and second optical couplers 210 and 220 in FIG. 2A is an exact 50/50 splitter (providing a 50/50 coupling ratio) to provide an almost perfect switch that completely switches off one of the output port 223 or 224. However, the configuration in FIG. 2B with the first, second and third optical couplers 240, 250 and 260 is able to achieve almost perfect switching, completely switching off one of the output ports 263 or 264, even when the first, second and third optical couplers 240, 250 and 260 are not exact 50/50 splitters. So, regardless of the actual coupling ratios of the first, second and third optical couplers 240, 250 and 260, respectively, the optical switch 200B is able to mimic a perfect optical switch.

The first optical coupler 240 includes input ports 241 and 242, and output ports 243 and 244; the second optical coupler 250 includes input ports 251 and 252, and output ports 253 and 254; and the third optical coupler 260 includes input ports 261 and 262, and output ports 263 and 264. The input ports 241 and 242 correspond to input ports of the optical switch 200B, and the output ports 263 and 264 correspond to output ports of the optical switch 200B, as mentioned above. Each of the first, second and third optical couplers 240, 250 and 260 may be symmetric couplers, for example.

Figure 3A:
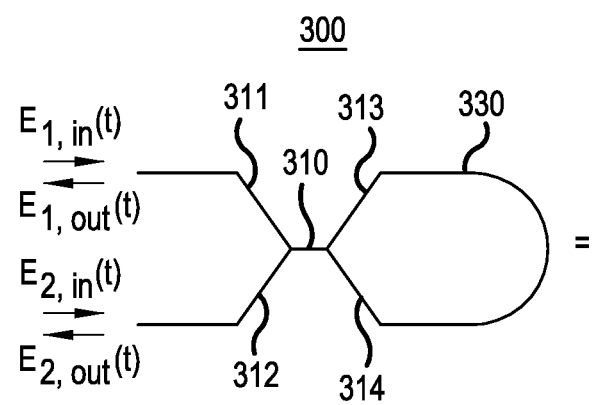
FIG. 3A is a schematic diagram of a loop mirror, according to a representative embodiment.
Figure 3B:
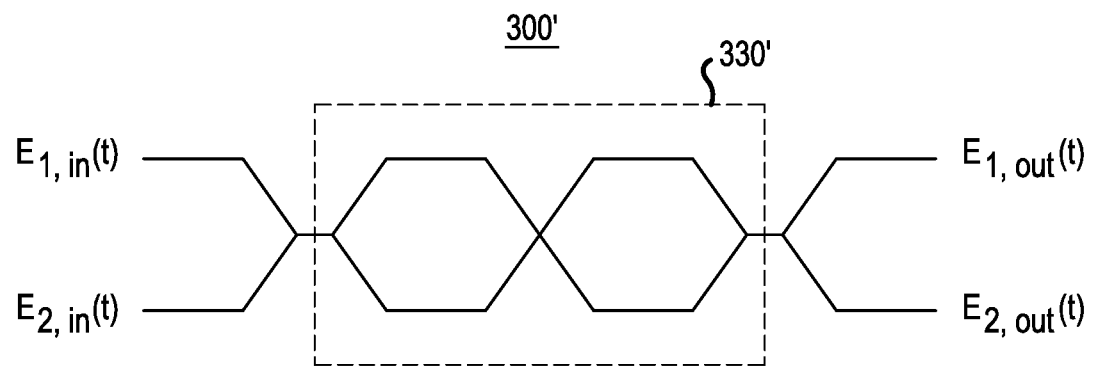
FIG. 3B is a schematic diagram of a functionally equivalent circuit of the loop mirror in FIG. 3A, according to a representative embodiment.

FIG. 3A is a schematic diagram of a loop mirror 300, and FIG. 3B is a schematic diagram of a functionally equivalent loop mirror circuit 300' of the loop mirror 300, according to a representative embodiment. Referring to FIG. 3A, the loop mirror 300 includes optical coupler 310 and optical loop 330. The optical coupler 310, which is a 2×2 optical coupler substantially the same as the optical coupler 100, includes input ports 311 and 312 and output ports 313 and 314. The optical loop 330 connects to the output ports 313 and 314 of the optical coupler 310, such that the input ports 311 and 312 of the optical coupler 310 correspond to input ports of the loop mirror 300. Thus, the input port 311 inputs the optical signal $E_{1,in}(t)$ and outputs the optical signal $E_{1,out}(t)$, and the input port 312 inputs the optical signal $E_{2,in}(t)$ and outputs the optical signal $E_{2,out}(t)$. This indicates reflection of the input optical signals $E_{1,in}(t)$ and $E_{2,in}(t)$ at the input ports 311 and 312, respectively.

In an alternative configuration, the optical coupler 310 may be implemented using a basic optical switch, such as the optical switch 200A shown in FIG. 2A. Referring to FIGS. 2A and 3A, using the optical switch 200A, the input port 211 would input the optical signal $E_{1,in}(t)$ and output the optical signal $E_{1,out}(t)$, the input port 212 would input the optical signal $E_{2,in}(t)$ and output the optical signal $E_{2,out}(t)$, and the output ports 213 and 214 would connect to the optical loop 330, while maintaining the functionality of the loop mirror 300. Therefore, instead of providing the optical coupler 310 with a 50/50 coupling ratio, the optical switch 200A may simply be tuned so that the phase sections (first and second switch phase shifters 233 and 234) are brought into an intermediate state so that the optical switch 200A effectively acts as an optical coupler with an exact 50/50 coupling ratio.

The loop mirror circuit 300' of FIG. 3B shows an "unfolded" depiction of the loop mirror 300, including optical loop circuit 330', enabling calculation of the transfer function of the loop mirror matrix. The relationships between the input and output fields of the loop mirror 300, derived from the loop mirror circuit 300', are provided by Equations (4) and (5), below:

$$\begin{bmatrix} E_{1,out}(t) \\ E_{2,out}(t) \end{bmatrix} = \begin{bmatrix} 2i\sqrt{\kappa(1-\kappa)} & 2\kappa - 1 \\ 2\kappa - 1 & 2i\sqrt{\kappa(1-\kappa)} \end{bmatrix} \begin{bmatrix} E_{1,in}(t) \\ E_{2,in}(t) \end{bmatrix} \quad \text{Equation (4)}$$

$$\kappa = \frac{1}{2}: \begin{bmatrix} E_{1,out}(t) \\ E_{2,out}(t) \end{bmatrix} = i \begin{bmatrix} 1 & 0 \\ 0 & 1 \end{bmatrix} \begin{bmatrix} E_{1,in}(t) \\ E_{2,in}(t) \end{bmatrix} \quad \text{Equation (5)}$$

As shown by FIGS. 3A and 3B, and by Equations (4) and (5), the optical loop 330 reflects any input light on the input port 311 back into the input port 311, and any input light on the input port 312 back into the input port 312, independently from each other, when the optical coupler 310 is a symmetric 3 dB coupler, for example.

FIG. 4A is a schematic diagram of a continuous phase tuning system, incorporating a loop mirror, and FIG. 4B is a schematic diagram of a functionally equivalent circuit of the continuous phase tuning system, according to a representative embodiment.

The continuous phase tuning system 400 (or, endless phase tuner) includes one optical switch, indicated by the optical switch 200A, coupled to a phase modulator 430. The phase modulator 430 includes first waveguide 431 with a first phase shifter 433 and second waveguide 432 with a second phase shifter 434. The first waveguide 431, with the corresponding first phase shifter 433, is connected between the first output port of the optical switch 200A (e.g., output port 223 of optical coupler 220) and the first input port of the loop mirror 300 (e.g., input port 311 of optical coupler 310). The second waveguide 432, with the corresponding second phase shifter 434, is connected between the second output port of the optical switch 200A (e.g., output port 224 of optical coupler 220) and the second input port of the loop mirror 300 (e.g., input port 312 of optical coupler 310). In the depicted embodiment, the first phase shifter 433 shifts the phase of the optical signal by $\theta_1$, and the second switch phase shifter 434 shifts the phase of the optical signal by $\theta_2$. The optical switch 200A alternately switches between (selects) the first waveguide 431 and the second waveguide 432 of the phase modulator 430. The optical signal is then phase shifted by the first phase shifter 433 or the second phase shifter 434, respectively, depending on the selected one of the first and second waveguides 431 and 432. In an embodiment, the functionality of the continuous phase tuning system 400 may be combined with the gain medium of a laser in the same material system (e.g., InP).

The continuous phase tuning system 400 further includes the loop mirror 300, which is configured to alternately receive the phase shifted optical signal from the first and second waveguides 431 and 432 in accordance with the switching, via corresponding first and second mirror input ports (e.g., input ports 311 and 312 of optical coupler 310), respectively, and to reflect the phase shifted optical signal back to the same first or second mirror input ports at which the phase shifted optical signal was received.

Figure 5:
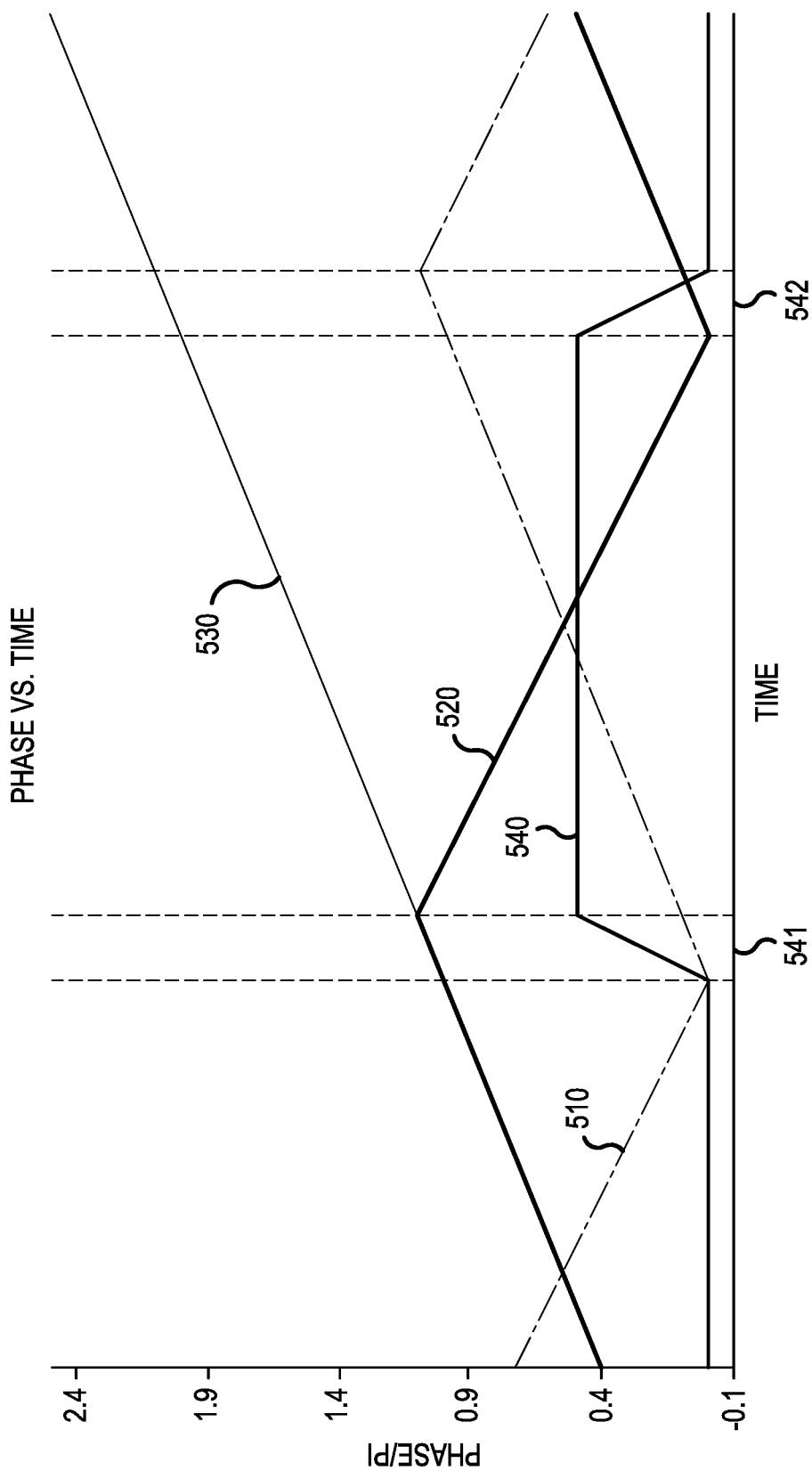
FIG. 5 is a graph showing endless phase shifting of the reflected optical signal in only the first input port of the loop mirror, according to a representative embodiment.

The first phase value $\theta_1$ of the first phase shifter 433 and the second phase value $\theta_2$ of the second phase shifter 434 are determined such that overall phase change of the continuous phase tuning system 400 continues to accumulate substantially linearly, as shown in FIG. 5 discussed below, while the optical switch 200A alternately switches between the first and second switch waveguides 231 and 232. For example, the optical switch 200A switches between the first and second switch waveguides 231 and 232 when a difference between the determined first phase value $\theta_1$ of the first phase shifter 433 and the determined second phase value $\theta_2$ of the second phase shifter 434 is an integer multiple of $\pi$. The one of the first and second phase shifters 433 and 434 that is not selected (switched out) by the optical switch 200A resets while the other one of the first and second phase shifters 433 and 434 is selected (switched in). That is, the second phase shifter 434 in the second waveguide 432 is reset while the optical switch 200A is switched to the first waveguide 431, and the first phase shifter 433 in the first waveguide 431 is reset while the optical switch 200A is switched to the second waveguide 432. Also, the second waveguide 432 contains substantially no light while the optical switch 200A is switched to the first waveguide 431, and the first waveguide 431 contains substantially no light while the optical switch 200A is switched to the second waveguide 432. Each of the first and second phase shifters 433 and 434 is reset by an integer multiple of $\pi$ when the resetting takes place, respectively.

The functionally equivalent continuous phase tuning system circuit 400' of FIG. 4B shows an "unfolded" depiction of the continuous phase tuning system 400, including optical loop circuit 330', enabling calculation of the transfer function of the continuous phase tuning system matrix. Assuming that all the optical couplers 210, 220, 310 are symmetric 3 dB couplers, for example, the relationship between the input and output fields of the continuous phase tuning system 400, derived from the continuous phase tuning system circuit 400', are indicated by Equations (6A) through (6C), in accordance with various phase values ($\varphi$ and $\theta$), as follows:

$$\varphi = \pm \frac{\pi}{2}: \begin{bmatrix} E_{1,out}(t) \\ E_{2,out}(t) \end{bmatrix} = -i \begin{bmatrix} e^{2i\theta_1} & 0 \\ 0 & e^{2i\theta_2} \end{bmatrix} \begin{bmatrix} E_{1,in}(t) \\ E_{2,in}(t) \end{bmatrix} \quad \text{Equation (6A)}$$

$$\varphi = 0: \begin{bmatrix} E_{1,out}(t) \\ E_{2,out}(t) \end{bmatrix} = -i \begin{bmatrix} e^{2i\theta_2} & 0 \\ 0 & e^{2i\theta_1} \end{bmatrix} \begin{bmatrix} E_{1,in}(t) \\ E_{2,in}(t) \end{bmatrix} \quad \text{Equation (6B)}$$

$$\theta_2 = n \cdot \pi + \theta_1: \begin{bmatrix} E_{1,out}(t) \\ E_{2,out}(t) \end{bmatrix} = -i \begin{bmatrix} e^{2i\theta_1} & 0 \\ 0 & e^{2i\theta_2} \end{bmatrix} \begin{bmatrix} E_{1,in}(t) \\ E_{2,in}(t) \end{bmatrix} \quad \text{Equation (6C)}$$

The optical signal reflected into the first mirror input port (input port 311) is shifted by twice the value of the first phase shifter 433 or the second phase shifter 434 depending on the state of the optical switch 200A. If the phase difference between the first phase value $\theta_1$ of the first phase shifter 433 and the second phase value $\theta_2$ of the second phase shifter 434 is an integer multiple of $\pi$, then the phase value $\varphi$ of the switch 200A does not influence the continuous phase tuning system matrix. Therefore, the corresponding phase shifts of the first and second phase shifters 433 and 434 are performed independently of the state of the optical switch 200A. Accordingly, the switching between the first and second waveguides 431 and 432 occurs while the phase difference between the first and second phase values $\theta_1$ and $\theta_2$ of the first and second phase shifters 433 and 434 is an integer multiple of $\pi$.

Figure 4C:
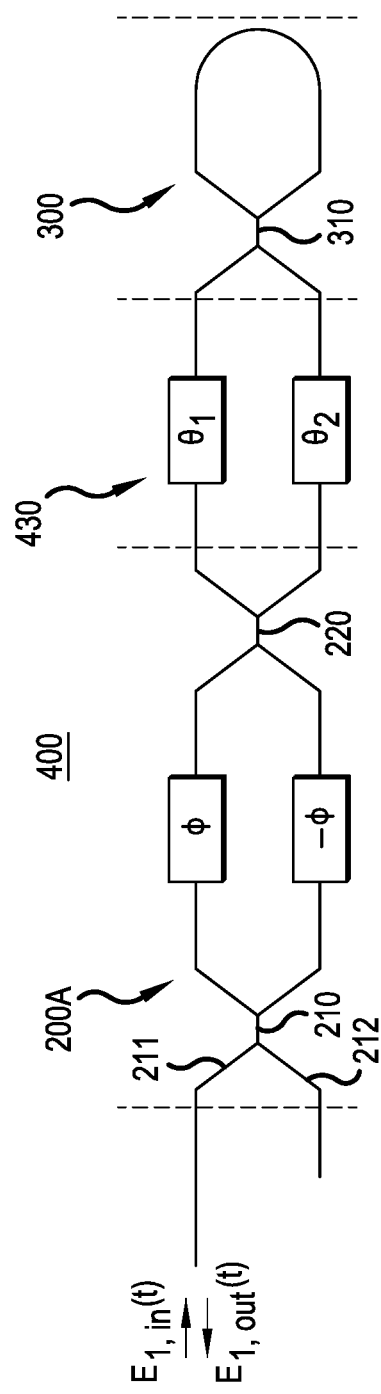
FIG. 4C is a schematic diagram of a continuous phase tuning system, incorporating a loop mirror, with one optical signal input, according to a representative embodiment.

FIG. 4C is a schematic diagram of a continuous phase tuning system 400, incorporating a loop mirror, with only one optical signal input, according to a representative embodiment. That is, the endless phase shift of the reflected optical signal is provided in only the first input port of the optical switch 200A (e.g., input port 211 of the first optical coupler 210). The resulting relationship between the input and output fields of the one input port in the continuous phase tuning system 400 may be indicated by Equations (7A) through (7C), in accordance with various phase values ($\varphi$ and $\theta$), as follows:

$$\varphi = \pm \frac{\pi}{2}: E_{1,out}(t) = -ie^{2i\theta_1} E_{1,in}(t) \quad \text{Equation (7A)}$$

$$\varphi = 0: E_{1,out}(t) = -ie^{2i\theta_2} E_{1,in}(t) \quad \text{Equation (7B)}$$

$$\theta_2 = n \cdot \pi + \theta_1: E_{1,out}(t) = -ie^{2i\theta_1} E_{1,in}(t) \quad \text{Equation (7C)}$$

The properties indicated by Equations (7A) through (7C) enable determination of a control sequence to provide endless phase shifting of the reflected optical signal in the input port 211 of the optical switch 200A (which corresponds to the first input port of the continuous phase tuning system 400). It is understood that in each of FIGS. 4A, 4B and 4C, the optical switch 200A may be replaced by the optical switch 200B without departing from the scope of the present teachings.

As mentioned above, FIG. 5 is a graph showing endless phase shifting of the reflected optical signal in the first input port of the loop mirror 300, according to a representative embodiment. As shown by curve 530, the phase increases substantially linearly regardless of the switching between the first and second waveguides 431 and 432 of the phase modulator 430, since the phase values of the first and second phase shifters 433 and 434 are periodically reset, as discussed above. The curve 530 corresponds to the visible result outside the continuous phase tuning system 400, regardless of the internal alternating between switching and resetting of the first and second phase shifters 433 and 434.

Referring to FIG. 5, the horizontal axis represents time, and the vertical axis represents phase (e.g., phase divided by π, to better depict a difference of one π between the curves). That is, to operate the optical switch 200A, the respective phase should transition from 0 to π/2. The vertical axis in FIG. 5 thus depicts phase shift, and not the voltage/current that induces the respective phase shift. Curve 510 shows the first phase value $\theta_1$ of the first phase shifter 433, curve 520 shows the second phase value $\theta_2$ of the second phase shifter 434, and curve 530 shows the accumulated phase obtained by alternating between the first and second phase values $\theta_1$ and $\theta_2$ of the phase modulator 430. Curve 540 is a control signal provided by the changing phase of the optical switch 200A. The type of control signal depends at least in part on the technology of the phase shifters. For example, the control signal may be a voltage for electro-optic or stress-optic phase shifters, and may be a (heater) current for thermos-optic phase shifters, or the control signal may comprise an magnetic field to induce the desired phase shift, without departing from the scope of the present teachings. The value of curve 540 determines which of the first or second phase values $\theta_1$ or $\theta_2$ to use in the loop mirror 300. As shown in FIG. 5, when curve 540 is low (e.g., 0), the optical switch 200A selects the second phase shifter 434, resulting in the second phase value $\theta_2$ increasing, as shown by curve 520, and the first phase value $\theta_1$ decreasing, as shown by curve 510.

When curve 540 begins to transition from low to high (e.g., 0.5), the optical switch 200A selects the first phase shifter 433, resulting in the first phase value $\theta_1$ increasing, as shown by curve 510. The second phase value $\theta_2$ continues to increase, as well, in a first transition period 541 during which curve 540 showing the control signal completes the transition from low to high. When curve 540 reaches its high value, the first phase value $\theta_1$ continues increasing, as shown by curve 510, and the second phase value $\theta_2$ begins decreasing, as shown by curve 520. The second phase shifter 434 resets while curve 520 is decreasing (i.e., the time during which the first phase shifter 433 is selected by the optical switch 200A). Then, when curve 540 begins to transition from high to low, the optical switch 200A again selects the second phase shifter 434, resulting in the second phase value $\theta_2$ increasing, as shown by curve 520. The first phase value $\theta_1$ continues to increase, as well, in a second transition period 542 during which curve 540 completes the transition from high to low. When curve 540 is reaches its low value, the second phase value $\theta_2$ continues increasing, as shown by curve 520, and the first phase value $\theta_1$ begins decreasing, as shown by curve 510. The first phase shifter 433 then resets while curve 510 is decreasing (i.e., the time during which the second phase shifter 434 is selected by the optical switch 200A). Meanwhile, as discussed above, the accumulated phase shown by curve 530 continues to increase, substantially linearly, throughout the switching between the first and second phase shifters 433 and 434. Also as discussed above, the switching occurs when the first and second phase values $\theta_1$ and $\theta_2$ of the first and second phase shifters 433 and 434 differ from one another by an integer multiple of π.

The above scheme enables linear shifting of the phase of the reflected optical signal. As a practical matter, the switching and phase shift control parameters will be bandwidth limited, leading to smooth edges. Regardless, the general principle that the switching can be done while the difference between the first and second phase values $\theta_1$ and $\theta_2$ of first and second phase shifters 433 and 434 is π is applicable, e.g., using slightly modified control parameter waveforms, as would be apparent to one of ordinary skill in the art.

The switching between the first and second phase shifters 433 and 434 may be initiated by a system controller (not shown) that operates the optical switch 200A. For example, the system controller may monitor the first and second phase values $\theta_1$ and $\theta_2$ of the first and second phase shifters 433 and 434. When the difference between the monitored first and second phase values $\theta_1$ and $\theta_2$ is an integer multiple of π, the system controller operates the optical switch 200A to switch to the other phase shifter.

In various embodiments, the system controller may be included with the continuous phase tuning system 400, or may be in a separate processor, computer, or other control unit. For example, the system controller may be implemented by a computer processor, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system. A memory (not shown) accessible by the controller 470 may be implemented by any number, type and combination of random access memory (RAM) and read-only memory (ROM), for example, and may store various types of information, such as computer programs and software algorithms executable by the controller 470 (and/or other components), as well as data and/or signals storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals). The system controller may communicate with the first, second, third and fourth optical switches 930, 940, 950 and 960 by various means, including wired and wireless communications.

Thus, according to various embodiments, the difference between a determined first phase value and a determined second phase value of phase shifters in a phase modulator is an integer multiple of π while operating the optical switch to switch from one to the other. The phase shifter that is not in use is reset while the other phase shifter is operational. That is, a second phase shifter in a second waveguide is reset while the optical switch is switched to a first waveguide, and a first phase shifter in the first waveguide is reset while the optical switch is switched to the second waveguide. Each of the first and second phase shifters is reset by an integer multiple of π Since the optical signal passes through the phase shifter twice due to the loop mirror, any shift that is a multiple of π is allowed as reset value.

As stated above, the continuous phase tuning system (400) may be integrated into an optical cavity of a tunable laser device. The tunable laser device includes, for example, an optical cavity that receives electromagnetic radiation, and a gain medium that is stimulated to produce an optical signal. The gain medium may be stimulated by optical pumping (using the electromagnetic radiation) or by current injection. According to embodiments of the disclosure, the tunable laser device also includes the continuous phase tuning system that continuously phase tunes the optical signal. The gain medium and the phase tuning system are located in the optical cavity.

The continuous phase tuning system includes one optical switch coupled to a phase modulator, the phase modulator including a first waveguide with a first phase shifter and a second waveguide with a second phase shifter. The one optical switch alternately switches between the first waveguide and the second waveguide, in which the optical signal is phase shifted by the first phase shifter or the second phase shifter, respectively. The loop mirror is configured to alternately receive the phase shifted laser optical signal from the first and second waveguides in accordance with the switching, via corresponding first and second mirror ports, respectively, and to reflect the phase shifted optical signal back to the same first or second mirror port at which the phase shifted laser optical signal was received. A difference between a first phase value of the first phase shifter and a second phase value of the second phase shifter is an integer multiple of π, such that overall phase change continues to accumulate substantially linearly while the optical switch alternately switches between the first waveguide and the second waveguide.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A system for continuously phase tuning an optical signal, the system comprising:
   one optical switch;
   a phase modulator coupled to the one optical switch, the phase modulator comprising a first waveguide including a first phase shifter and a second waveguide including a second phase shifter, wherein the one optical switch alternately switches between the first waveguide and the second waveguide of the phase modulator, in which the optical signal is phase shifted by the first phase shifter or the second phase shifter, respectively, corresponding to the first waveguide or the second waveguide to which the optical signal is switched; and
   a loop mirror coupled to the phase modulator, the loop mirror being configured to alternately receive the phase shifted optical signal from the first and second waveguides in accordance with the switching by the one optical switch, via corresponding first and second mirror inputs, respectively, and to reflect the phase shifted optical signal back to the same first or second mirror input at which the phase shifted optical signal was received,
   wherein a first phase value of the first phase shifter and a second phase value of the second phase shifter are determined such that overall phase change of the system accumulates continuously while the optical switch alternately switches between the first waveguide and the second waveguide.

2. The system of claim 1, wherein a difference between the determined first phase value and the determined second phase value is an integer multiple of π while operating the optical switch to switch between the first waveguide and the second waveguide.

3. The system of claim 2, wherein the second phase shifter in the second waveguide is reset while the optical switch is switched to the first waveguide, and the first phase shifter in the first waveguide is reset while the optical switch is switched to the second waveguide.

4. The system of claim 3, wherein each of the first and second phase shifters is reset by an integer multiple of π.

5. The system of claim 1, wherein the one optical switch is a Mach-Zehnder interferometer (MZI) switch or a modified MZI switch, including at least one switch phase shifter to enable the switching.

6. The system of claim 1, wherein the overall phase change of the system continuously accumulates substantially linearly while the optical switch alternately switches between the first waveguide and the second waveguide.

7. A system for continuously phase tuning an optical signal, the system comprising:
   a single Mach-Zehnder interferometer (MZI) switch configured to switch the optical signal between a first switch output and a second switch output;
   a phase modulator comprising a first waveguide coupled to the first switch output of the single MZI switch and a second waveguide coupled to the second switch output of the single MZI switch, the first waveguide including a first phase shifter with a first phase value and the second waveguide including a second phase shifter with a second phase value, wherein a difference between the first and second phase values is an integer multiple of π, while operating the single MZI switch; and
   a loop mirror comprising a first mirror port coupled to a first output of the first waveguide and a second mirror port coupled to a second output of the second waveguide,
   wherein the single MZI switch alternately switches the optical signal between the first waveguide and the second waveguide of the phase modulator, such that the optical signal is phase shifted by the first phase value and the second phase value, respectively, wherein the loop mirror alternately receives the phase shifted optical signal at the first and second mirror ports, respectively, in accordance with the switching by the single MZI switch, and reflects the phase shifted optical signal back to the same first or second mirror port at which the phase shifted optical signal was received, and wherein a phase change of the reflected optical signal accumulates uninterrupted while the single MZI switch alternately switches between the first waveguide and the second waveguide of the phase modulator.

8. The system of claim 7, wherein the accumulation of the phase change of the reflected optical signal is substantially linear.

9. The system of claim 7, wherein the single MZI switch comprises:
a first optical coupler comprising a first input for receiving the optical signal, a second input that receives none of the optical signal, a first output connected to a first waveguide and a second output connected to a second waveguide; and
a second optical coupler comprising a first input connected to the first switch waveguide, a second input connected to the second switch waveguide, a first output connected to the first waveguide of the phase modulator, and a second output connected to the second waveguide of the phase modulator.

10. The system of claim 7, wherein the second phase shifter in the second waveguide is reset by integer multiples of π while the single MZI switch switches to the first waveguide, and the first phase shifter in the first waveguide is reset by integer multiples of π while the single MZI switch switches to the second waveguide.

11. The system of claim 7, wherein the second waveguide contains substantially no light while the single MZI switch is switched to the first waveguide, and the first waveguide contains substantially no light while the single MZI switch is switched to the second waveguide.

12. The system of claim 7, further comprising:
a system controller programmed to control the single MZI switch to switch such that an overall phase change of the system accumulates uninterrupted while the single MZI switch alternately switches between the first waveguide and the second waveguide of the phase modulator.

13. The system of claim 9, wherein each of the first and second optical couplers is a 2×2 optical coupler, and wherein each of the 2×2 optical couplers is a symmetric 3 dB coupler.

14. The system of claim 7, wherein the single MZI switch is a modified MZI switch comprising:
a first optical coupler comprising a first input for receiving the optical signal, a second input that receives none of the optical signal, a first output connected to a first switch waveguide and a second output connected to a second switch waveguide;
a second optical coupler comprising a first input connected to the first switch waveguide, a second input connected to the second switch waveguide, a first output connected to a third switch waveguide and a second output connected to a fourth switch waveguide; and
a third optical coupler comprising a first input connected to the third switch waveguide, and a second input connected to the fourth switch waveguide.

15. The system of claim 7, wherein at least the phase modulator and the loop mirror is combined with a gain medium of a laser device.

16. The system of claim 15, wherein at least the phase modulator and the loop mirror are implemented in one of silicon, silicon dioxide, silicon nitride or indium phosphide.

17. A tunable integrated laser device, comprising:
an optical cavity that stores electromagnetic radiation;
a gain medium, in the optical cavity, that is stimulated to produce an optical signal; and
a phase tuning system, in the optical cavity, that continuously phase tunes the optical signal, the phase tuning system comprising:
one optical switch;
a phase modulator coupled to the one optical switch, the phase modulator comprising a first waveguide including a first phase shifter and a second waveguide including a second phase shifter, wherein the one optical switch alternately switches between the first waveguide and the second waveguide, in which the optical signal is phase shifted by the first phase shifter or the second phase shifter, respectively; and
a loop mirror coupled to the phase modulator, the loop mirror configured to alternately receive the phase shifted optical signal from the first and second waveguides in accordance with the switching, via corresponding first and second mirror ports, respectively, and to reflect the phase shifted optical signal back to the same first or second mirror port at which the phase shifted optical signal was received,
wherein a difference between a first phase value of the first phase shifter and a second phase value of the second phase shifter is an integer multiple of π, such that overall phase change accumulates continuously while the optical switch alternately switches between the first waveguide and the second waveguide.

18. The device of claim 17, wherein the gain medium is stimulated by optical pumping or by current injection.

19. The device of claim 17, wherein the continuously accumulating overall phase change is substantially linear.

20. The device of claim 17, wherein the second phase shifter in the second waveguide is reset by an integer multiple of π while the optical switch is switched to the first waveguide, and the first phase shifter in the first waveguide is reset by an integer multiple of π while the optical switch is switched to the second waveguide.

* * * * *